(12) United States Patent
Im et al.

(10) Patent No.: US 8,587,134 B2
(45) Date of Patent: Nov. 19, 2013

(54) SEMICONDUCTOR PACKAGES

(75) Inventors: Yun-hyeok Im, Hwaseong-si (KR); Won-keun Kim, Hwaseong-si (KR); Tae-Je Cho, Hwaseong-si (KR); Kyol Park, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/587,330

(22) Filed: Aug. 16, 2012

(65) Prior Publication Data

US 2013/0134606 A1    May 30, 2013

(30) Foreign Application Priority Data

Nov. 25, 2011    (KR) .................. 10-2011-0124392

(51) Int. Cl.
*H01L 23/52*    (2006.01)
*H01L 23/48*    (2006.01)
*H01L 29/40*    (2006.01)

(52) U.S. Cl.
USPC .............. 257/786; 257/E23.015; 257/746; 257/778; 257/780; 438/612; 438/666

(58) Field of Classification Search
USPC ....... 257/E23.02, E23.015, E23.01, E23.117, 257/773, 778, 734, 746, 780–783, 785, 795, 257/798; 438/108, 119, 612, 614, 665, 666, 438/926
See application file for complete search history.

(56) References Cited

U.S. PATENT DOCUMENTS

| | | | |
|---|---|---|---|
| 5,903,056 A * | 5/1999 | Canning et al. ............... | 257/773 |
| 5,981,313 A | 11/1999 | Tanaka | |
| 6,528,417 B1 * | 3/2003 | Wang et al. ................... | 438/665 |
| 6,867,505 B2 * | 3/2005 | Lee et al. ....................... | 257/783 |
| 6,881,654 B2 * | 4/2005 | Chen et al. .................... | 438/497 |
| 7,164,208 B2 * | 1/2007 | Kainou et al. ................ | 257/780 |
| 7,294,900 B2 * | 11/2007 | Asano ........................... | 257/472 |
| 8,097,958 B2 * | 1/2012 | Sawada et al. ................ | 257/778 |
| 8,193,639 B2 * | 6/2012 | Liu et al. ....................... | 257/737 |
| 8,354,735 B2 * | 1/2013 | Lee et al. ...................... | 257/620 |
| 8,377,815 B2 * | 2/2013 | Chang et al. .................. | 438/612 |
| 8,470,705 B2 * | 6/2013 | Weng et al. ................... | 438/598 |
| 2002/0111054 A1 * | 8/2002 | Huang et al. .................. | 439/83 |
| 2004/0041393 A1 * | 3/2004 | Lee ................................ | 283/100 |
| 2006/0279000 A1 * | 12/2006 | Chang et al. ................. | 257/779 |
| 2012/0049350 A1 * | 3/2012 | Grillberger et al. .......... | 257/737 |

FOREIGN PATENT DOCUMENTS

| | | |
|---|---|---|
| JP | 2000031345 A | 1/2000 |
| JP | 2000031348 A | 1/2000 |

* cited by examiner

*Primary Examiner* — Chris Chu
(74) *Attorney, Agent, or Firm* — Harness, Dickey & Pierce, P.L.C.

(57) ABSTRACT

A semiconductor package may include a substrate including a substrate pad on a top surface thereof; at least one semiconductor chip including a connection terminal electrically connected to the substrate on an active surface thereof, and mounted on the substrate; a heat release pattern formed between the substrate and the at least one semiconductor chip and configured to generate heat; and underfill resin underfilled between the substrate and the at least one semiconductor chip and comprising fillers. A semiconductor package may include a substrate including a substrate pad on a top surface thereof and a first heat release pattern configured to generate heat, and a semiconductor chip including a bonding pad formed on an active surface facing the substrate and a second heat release pattern configured to generate heat.

20 Claims, 13 Drawing Sheets

SEMICONDUCTOR PACKAGES

CROSS-REFERENCE TO RELATED APPLICATION(S)

This application claims priority from Korean Patent Application No. 10-2011-0124392, filed on Nov. 25, 2011, in the Korean Intellectual Property Office (KIPO), the entire contents of which are incorporated herein by reference.

BACKGROUND

1. Field

Example embodiments may relate to semiconductor packages. Example embodiments also may relate to semiconductor packages capable of adjusting distribution of fillers.

2. Description of Related Art

In general, a plurality of semiconductor chips are formed by performing various semiconductor processes on a wafer. Then, a semiconductor package is formed by performing a packaging process on the wafer in order to mount the semiconductor chips on a substrate. The semiconductor package may include a semiconductor chip, a substrate on which the semiconductor chip is mounted, a bonding wire or a bump that electrically connects the semiconductor chip and the substrate, and underfill resin for bonding the semiconductor chip and the substrate. However, it is required to use fillers during an underfill process in order to increase reliability of the semiconductor package due to a difference in a coefficient of thermal expansion (CTE) between the semiconductor chip and the substrate.

SUMMARY

Example embodiments may provide semiconductor packages that include heat release patterns capable of controlling a distribution of fillers between a semiconductor chip and a substrate. Example embodiments also may provide increasing reliability of semiconductor packages.

In some example embodiments, a semiconductor package may comprise a substrate comprising a substrate pad on a top surface thereof; at least one semiconductor chip comprising a connection terminal electrically connected to the substrate on an active surface thereof, and mounted on the substrate; a heat release pattern formed between the substrate and the at least one semiconductor chip and configured to generate heat; and/or underfill resin underfilled between the substrate and the at least one semiconductor chip and comprising fillers.

In some example embodiments, the heat release pattern may be a microwave sensitive pattern in which heat is generated by microwaves or a micro heat pattern in which heat is generated by applying power.

In some example embodiments, the heat release pattern may have a doughnut, bar, cylinder, or helix shape.

In some example embodiments, the heat release pattern may be formed on a top surface of the substrate.

In some example embodiments, the heat release pattern may be spaced apart from the substrate pad or from an upper portion of one side of the substrate pad.

In some example embodiments, the heat release pattern may be formed to partially or wholly surround the substrate pad.

In some example embodiments, the heat release pattern may be formed on the active surface of the at least one semiconductor chip.

In some example embodiments, the at least one semiconductor chip may be electrically connected to the substrate through flipchip bonding.

In some example embodiments, the active surface of the at least one semiconductor chip may face the substrate. The at least one semiconductor chip may further comprise a bonding pad formed on the active surface and electrically connected to the connection terminal.

In some example embodiments, the heat release pattern may be spaced apart from the bonding pad or from a lower portion of one side of the bonding pad. The heat release pattern may be formed to partially or wholly surround the bonding pad.

In some example embodiments, the at least one semiconductor chip may be formed by stacking a plurality of semiconductor chips and electrically connecting the plurality of semiconductor chips by using through-silicon vias.

In some example embodiments, a semiconductor package may comprise a substrate comprising a substrate pad on a top surface thereof and a first heat release pattern configured to generate heat, and/or a semiconductor chip comprising a bonding pad formed on an active surface facing the substrate and a second heat release pattern configured to generate heat.

In some example embodiments, the semiconductor package may further comprise a connection terminal formed between the substrate and the semiconductor chip and configured to electrically connect the substrate and the semiconductor chip, and/or a third heat release pattern formed on one side surface of the connection terminal or formed to partially or wholly surround the connection terminal and configured to generate heat.

In some example embodiments, the semiconductor package may further comprise a protection layer formed on the first heat release pattern or the second heat release pattern.

In some example embodiments, the first heat release pattern may be spaced apart from the substrate pad and is formed to partially or wholly surround the substrate pad. The second heat release pattern may be spaced apart from the bonding pad and is formed to partially or wholly surround the bonding pad.

In some example embodiments, a semiconductor package may comprise a substrate, at least one semiconductor chip on the substrate, and/or a heat release pattern between the substrate and the at least one semiconductor chip. The at least one semiconductor chip may be electrically connected to the substrate. The heat release pattern may be configured to generate heat.

In some example embodiments, the semiconductor package may further comprise resin between the substrate and the at least one semiconductor chip.

In some example embodiments, the resin may comprise one or more fillers.

In some example embodiments, the heat release pattern may comprise one or more microwave sensitive patterns configured to generate heat using microwaves.

In some example embodiments, the heat release pattern may comprise one or more micro heat patterns configured to generate heat using power applied to the one or more micro heat patterns.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
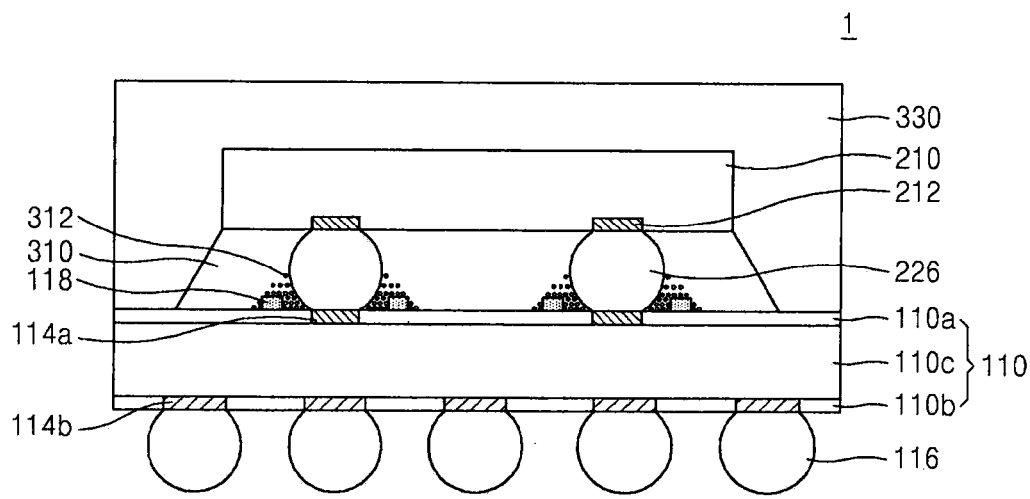
FIG. 1 is a cross-sectional view illustrating a semiconductor package according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a cross-sectional view illustrating a semiconductor package 1 according to some example embodiments.

Referring to FIG. 1, the semiconductor package 1 may include a substrate 110 and at least one semiconductor chip 210 stacked on the substrate 110.

The semiconductor chip 210 may be mounted on the substrate 110 through flipchip bonding. That is, first connection terminals 226 may be formed between a top surface of the substrate 110 and bonding pads 212 of the semiconductor chip 210, and the semiconductor chip 210 and the substrate 110 may be electrically connected to each other through the first connection terminals 226. The first connection terminals 226 may be, for example, solder bumps or solder balls.

The semiconductor chip 210 may include an integrated circuit therein. For example, the integrated circuit may include a memory circuit or a logic circuit. The semiconductor chip 210 may be a controller, flash memory, phase-change random-access memory (PRAM), random access memory (RRAM), ferroelectric random access memory (FeRAM), magnetic random access memory (MRAM), dynamic random-access memory (DRAM), and the like.

Gaps are formed between the first connection terminals 226 that electrically connect the semiconductor chip 210 and the substrate 110. Thus, an underfill process may be performed between the semiconductor chip 210 and the substrate 110 in order to secure joint reliability between the semiconductor chip 210 and the substrate 110. An underfill resin 310 may be epoxy resin having low viscosity. However, the inventive concept is not limited thereto.

The underfill resin 310 may include fillers 312 that reduce a difference in CTE between the semiconductor chip 210 and the substrate 110, and thus a function of reducing mechanical stress therebetween may be performed. The fillers 312 may be silica or alumina.

The substrate 110 may be a printed circuit board (PCB), a flexible PCB, a tape substrate, and the like. The substrate 110 may include, for example, a core board 110c having top and bottom surfaces facing each other, and a first resin layer 110a and a second resin layer 110b formed respectively on the top and bottom surfaces of the core board 110c.

The first resin layer 110a may include first substrate pads 114a used to electrically connect the substrate 110 and the semiconductor chip 210. The at least one semiconductor chip 210 may be mounted on the first resin layer 110a. Although one semiconductor chip 210 is mounted on the first resin layer 110a in FIG. 1, a plurality of semiconductor chips 210 may be mounted on the first resin layer 110a.

The second resin layer 110b may include second substrate pads 114b used to electrically connect the substrate 110 and second connection terminals 116. The second connection terminals 116 may be, for example, conductive bumps like solder balls, pins, lead lines, and the like. Solder balls may be formed of lead (Pb), tin (Sn), alloy(s) of lead (Pb) and tin (Sn), copper (Cu), aluminum (Al), and the like, and may be formed by a soldering device. However, the inventive concept is not limited thereto.

First heat release patterns 118 may be formed on the top surface of the substrate 110, and thus a locally high temperature range may be formed on the top surface of the substrate 110. The fillers 312 tend to flock to a high temperature region due to a thermophoresis, and thus a distribution of the fillers 312 used in the underfill process may be controlled by generating high thermal heat to the first heat release patterns 118.

That is, the first heat release patterns 118 may be formed in a region in which the fillers 312 are desired to be collected, thereby freely controlling the distribution of the fillers 312 in the underfill process.

The first heat release patterns 118 may be spaced apart from the first substrate pads 114a. However, the inventive concept is not limited thereto. The first heat release patterns 118 may be formed in top portions of one side of the first substrate pads 114a. The first heat release patterns 118 may be formed to partially or wholly surround the first substrate pads 114a. For example, the first heat release patterns 118 may be formed in a doughnut shape. However, the inventive concept is not limited thereto.

If the first heat release patterns 118 formed around the first substrate pads 114a are heated at a high temperature, since the fillers 312 may be collected in lower side surfaces of the first connection terminals 226 in the underfill process as shown in FIG. 1, joint reliability between the substrate 110 and the first connection terminals 226 may increase.

That is, the distribution of the fillers 312 around the first connection terminals 226 may increase, thereby preventing the first connection terminals 226 from cracking by increasing modulus around the first connection terminals 226. Also, a filler distribution around the semiconductor chip 210 other than the first connection terminals 226 may be reduced, thereby reducing modulus of underfill resin around the semiconductor chip 210. Thus, the difference in the CTE between the semiconductor chip 210 and the substrate 110 may minimize delamination or cracking of the semiconductor chip 210. Therefore, according to some example embodiments, reliability of the semiconductor package 1 may increase.

The first heat release patterns 118 may be microwave sensitivity patterns in which heat is generated by microwave or micro heater patterns in which heat is generated by applying power.

If the first heat release patterns 118 are microwave sensitivity patterns in which heat is generated by microwave, microwave sensitivity patterns may be formed of a microwave susceptibility material. The microwave susceptibility material may be ferrite, ferrite alloy, carbon, polyester, aluminum, metallic salt, polymer, or the like.

If the first heat release patterns 118 are micro heater patterns, micro heater patterns may be formed of molybdenum (Mo), tungsten (W), silicon carbide (SiC), and the like.

An example where the fillers 312 used in the underfill process are collected by using the first heat release patterns 118 is described above. However, the inventive concept is not limited thereto. The first heat release patterns 118 may be used in other processes such as a molding process in which the fillers 312 are used.

The semiconductor package 1 may further include a molding member 330. The molding member 330 may be formed by covering the top surface of the substrate 110, and side and top surfaces of the semiconductor chip 210. The molding member 330 may be manufactured by using various synthetic resin materials including epoxy resin, a hardener, organic/inorganic charging materials, etc., and may be ejected and molded inside a mold. The molding member 330 may be formed of polymer-like resin, for example, an epoxy molding compound (EMC).

Figure 2:
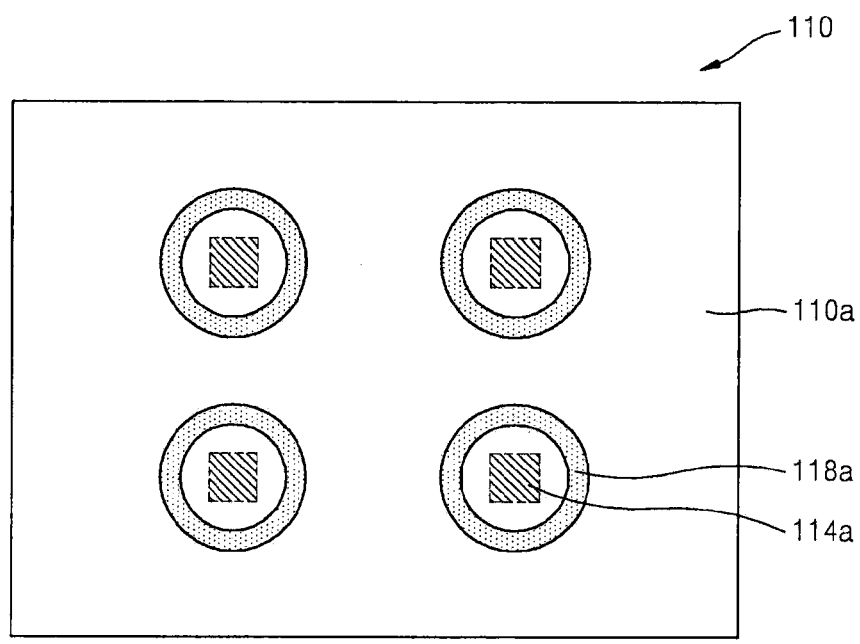
FIG. 2 is a schematic plan view of a substrate on which microwave sensitivity patterns are formed according to some example embodiments.

FIG. 2 is a schematic plan view of the substrate 110 on which microwave sensitivity patterns 118a are formed according to some example embodiments.

Referring to FIGS. 1 and 2, the microwave sensitivity patterns 118a may be formed on the top surface of the substrate 110, i.e., on the first resin layer 110a.

The microwave sensitivity patterns 118a may be spaced apart from the first substrate pads 114a. However, the inventive concept is not limited thereto. The microwave sensitivity patterns 118a may be formed in top portions of one side of the first substrate pads 114a. The microwave sensitivity patterns 118a may be formed to partially or wholly surround the first substrate pads 114a. For example, the microwave sensitivity patterns 118a may be formed in a doughnut shape. However, the inventive concept is not limited to the shapes of the microwave sensitivity patterns 118a. The microwave sensitivity patterns 118a may have different polygonal or closed surface shapes.

The microwave sensitivity patterns 118a may be heated to high temperature(s) by providing microwaves, and thus the fillers 312 used in an underfill process may be collected around the heated microwave sensitivity patterns 118a.

Therefore, a distribution of the fillers 312 may be freely controlled according to locations and shapes of the microwave sensitivity patterns 118a formed on the substrate 110. Also, temperatures of the microwave sensitivity patterns 118a may be controlled according to a period of time for which microwave energy is provided to the microwave sensitivity patterns 118a, and thus the distribution of the fillers 312 may also be controlled.

Also, since the first connection terminals 226 are formed on the first substrate pads 114a, the fillers 312 are collected around the microwave sensitivity patterns 118a heated to the high temperature(s) by the provided microwave, and thus the fillers 312 may be discontinuously distributed in a space between the first connection terminals 226. Thus, the distribution of the fillers 312 included in the underfill resin 310 may be spatially separated from each other.

Figure 3:
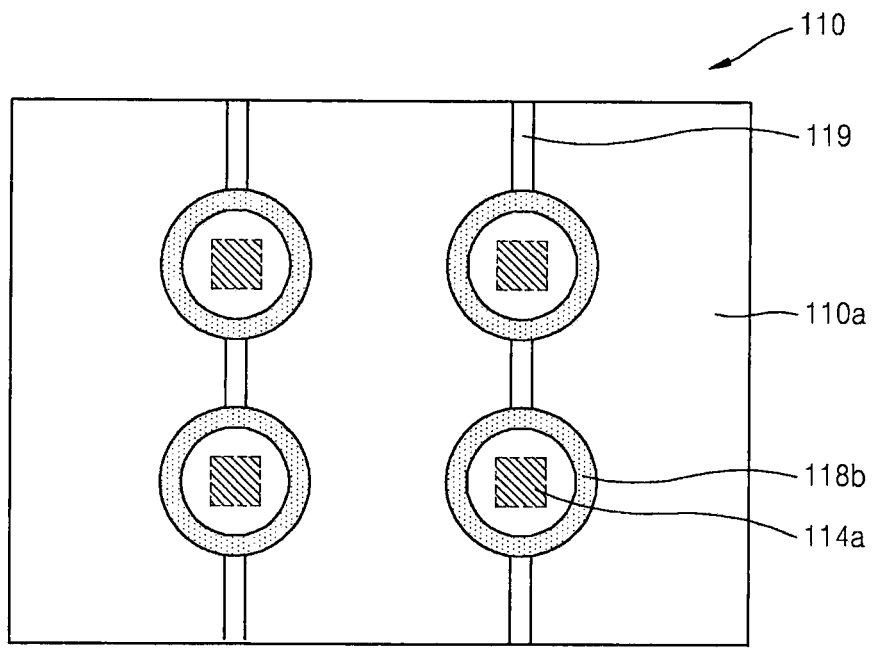
FIG. 3 is a schematic plan view of a substrate on which micro heater patterns are formed according to some example embodiments.

FIG. 3 is a schematic plan view of the substrate 110 on which micro heater patterns 118b are formed according to some example embodiments.

Referring to FIGS. 1 and 3, the micro heater patterns 118b may be formed on the top surface of the substrate 110, i.e., on the first resin layer 110a. The micro heater patterns 118b may be spaced apart from the first substrate pads 114a, and may be electrically connected to each other by power connection units 119. However, the inventive concept is not limited thereto. The micro heater patterns 118b may be formed in top portions of one side of the first substrate pads 114a.

The micro heater patterns 118b may also be formed to partially or wholly surround the first substrate pads 114a. For example, the micro heater patterns 118b may be formed in a doughnut shape. However, the inventive concept is not limited to the shapes of the micro heater patterns 118b. The micro heater patterns 118b may have different polygonal or closed surface shapes.

Power is applied to the micro heater patterns 118b through the power connection units 119, and thus the micro heater patterns 118b may be heated to high temperature(s). The fillers 312 may be collected around the micro heater patterns 118b heated to the high temperature(s), and thus a distribution of the fillers 312 may be controlled by adjusting locations and shapes of the micro heater patterns 118b. Also, the distribution of the fillers 312 may be controlled according to an amount and a period of time of power applied to the micro heater patterns 118b.

Also, since the first connection terminals 226 are formed on the first substrate pads 114a, the fillers 312 are collected around the micro heater patterns 118b heated according to the applied power, and thus the fillers 312 may be discontinuously distributed in a space between the first connection terminals 226. Thus, the distribution of the fillers 312 included in the underfill resin 310 may be spatially separated from each other.

Figure 4:
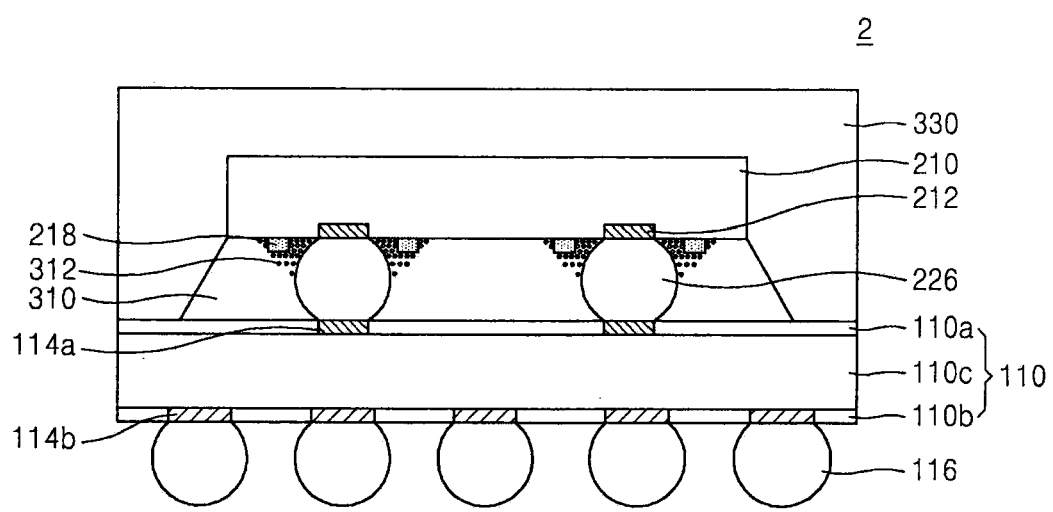
FIG. 4 is a schematic cross-sectional view illustrating a semiconductor package according to some example embodiments.

FIG. 4 is a schematic cross-sectional view illustrating a semiconductor package 2 according to some example embodiments.

Referring to FIG. 4, unlike the semiconductor package 1 described with reference to FIG. 1, the first heat release patterns 118 are not formed on the first resin layer 110a of the substrate 110 but second heat release patterns 218 may be formed on a bottom surface of the semiconductor chip 210, i.e. an active surface.

The second heat release patterns 218 may be microwave sensitivity patterns in which heat is generated by microwave or micro heater patterns in which heat is generated by applying power.

If the second heat release patterns 218 are microwave sensitivity patterns in which heat is generated by microwave, microwave sensitivity patterns may be formed of a microwave susceptibility material. The microwave susceptibility material may be ferrite, ferrite alloy, carbon, polyester, aluminum, metallic salt, polymer, or the like.

If the second heat release patterns 218 are micro heater patterns, micro heater patterns may be formed of molybdenum (Mo), tungsten (W), silicon carbide (SiC), and the like.

The second heat release patterns 218 may be spaced apart from the bonding pads 212. However, the inventive concept is not limited thereto, and the second heat release patterns 218 may be formed in lower portions of one side of the bonding pads 212.

The second heat release patterns 218 may be formed to partially or wholly surround the bonding pads 212. For example, the second heat release patterns 218 may be formed in a doughnut shape. However, the inventive concept is not limited to the shapes of the second heat release patterns 218. The second heat release patterns 218 may have different polygonal or closed surface shapes.

According to the present embodiment, the distribution of the fillers 312 may be controlled in such a way that the fillers 312 may be collected in side surfaces of upper portions of the first connection terminals 226 on which the second heat release patterns 218 are formed, by generating high temperature heat in the second heat release patterns 218 formed on the bottom surface of the semiconductor chip 210.

Figure 5:
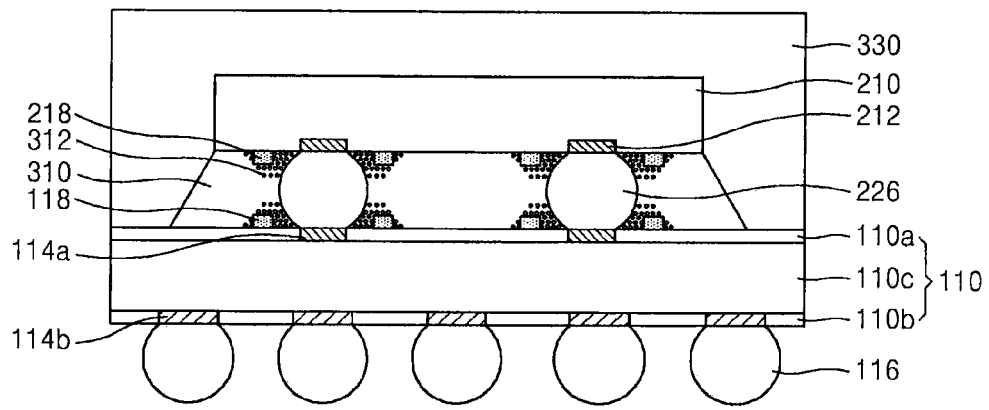
FIG. 5 is a schematic cross-sectional view illustrating a semiconductor package according to some example embodiments.

FIG. 5 is a schematic cross-sectional view illustrating a semiconductor package 3 according to some example embodiments.

Referring to FIG. 5, the first heat release patterns 118 of the semiconductor package 3 may be formed on the first resin layer 110a as well as, unlike the semiconductor package 1 described with reference to FIG. 1, and second heat release patterns 218 may be formed on the bottom surface of the semiconductor chip 210, i.e. an active surface.

The first heat release patterns 118 may be microwave sensitivity patterns or micro heater patterns. The second heat release patterns 218 may be microwave sensitivity patterns or micro heater patterns.

If the first heat release patterns 118 and the second heat release patterns 218 are heated to high temperature(s), the fillers 312 may move to the first heat release patterns 118 and the second heat release patterns 218.

For example, if the first heat release patterns 118 and the second heat release patterns 218 are microwave sensitivity patterns, and microwaves having the same frequency band are transferred to the first heat release patterns 118 and the second heat release patterns 218, a temperature gradient between the first heat release patterns 118 and the second heat release patterns 218 may be formed by adjusting the number or widths of the second heat release patterns 218 formed on the bottom surface of the semiconductor chip 210 and the first heat release patterns 118 formed on the first resin layer 110a of the substrate 110, thereby controlling a distribution of the fillers 312 up and down of the first heat release patterns 118 and the second heat release patterns 218.

Also, if the first heat release patterns 118 and the second heat release patterns 218 are micro heater patterns, and the same power is transferred to the first heat release patterns 118 and the second heat release patterns 218, a temperature gradient between the first heat release patterns 118 and the second heat release patterns 218 may be formed by adjusting the number or widths of the second heat release patterns 218 formed on the bottom surface of the semiconductor chip 210 and the first heat release patterns 118 formed on the first resin layer 110a of the substrate 110, thereby controlling a distribution of the fillers 312 up and down of the first heat release patterns 118 and the second heat release patterns 218.

Also, if the first heat release patterns 118 are micro heater patterns, temperatures of the first heat release patterns 118 may be adjusted by controlling an amount and a period of time of current applied to the first heat release patterns 118. If the second heat release patterns 218 are microwave sensitivity patterns, temperatures of the second heat release patterns 218 may be adjusted by controlling energy of microwave transferred to the second heat release patterns 218. Thus, the distribution of the fillers 312 up and down of the first heat release patterns 118 and the second heat release patterns 218 by forming a desired temperature gradient between the first heat release patterns 118 and the second heat release patterns 218.

Also, if the first heat release patterns 118 are microwave sensitivity patterns, temperatures of the first heat release patterns 118 may be adjusted by controlling energy of microwave transferred to the first heat release patterns 118. If the second heat release patterns 218 are micro heater patterns, temperatures of the second heat release patterns 218 may be adjusted by controlling an amount and a period of time of current applied to the second heat release patterns 218. Thus, the distribution of the fillers 312 up and down of the first heat release patterns 118 and the second heat release patterns 218 by forming a desired temperature gradient between the first heat release patterns 118 and the second heat release patterns 218.

Figure 6:
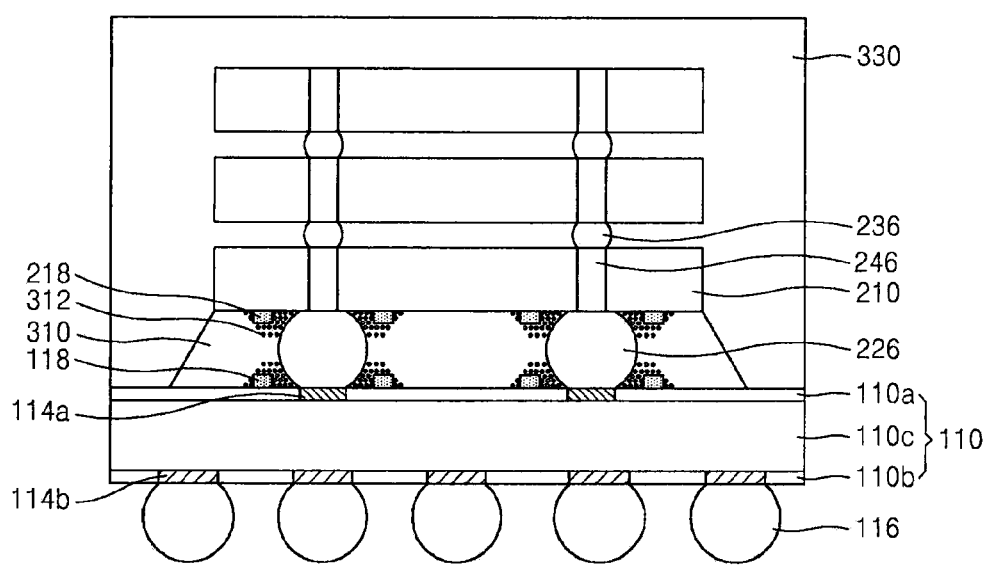
FIG. 6 is a schematic cross-sectional view illustrating a semiconductor package according to some example embodiments.

FIG. 6 is a schematic cross-sectional view illustrating a semiconductor package 4 according to some example embodiments.

Referring to FIG. 6, the semiconductor package 4 may include the substrate 110 including the first heat release patterns 118 formed on a top surface of the substrate 110, the plurality of semiconductor chips 210 that are stacked and are electrically connected to each other by using through-silicon vias 246 and third connection terminals 236, and the second heat release patterns 218 formed on a bottom surface of the lowest semiconductor chip 210.

The plurality of semiconductor chips 210 may be homogeneous products or heterogeneous products. For example, some of the semiconductor chips 210 may be memory chips, and the others may be non-memory chips. The semiconductor chips 210 may include controllers, flash memory, PRAM, RRAM, FeRAM, MRAM, DRAM, and the like.

The first heat release patterns 118 formed on the top surface of the substrate 110 may be microwave sensitivity patterns or micro heater patterns. The second heat release patterns 218 may be microwave sensitivity patterns or micro heater patterns.

To control a distribution of the fillers 312 up and down of the first heat release patterns 118 and the second heat release patterns 218 by generating high temperature heat in the first heat release patterns 118 and the second heat release patterns 218 is the same as described with reference to FIG. 5, and thus the same description therebetween will not be repeated here.

Figure 7:
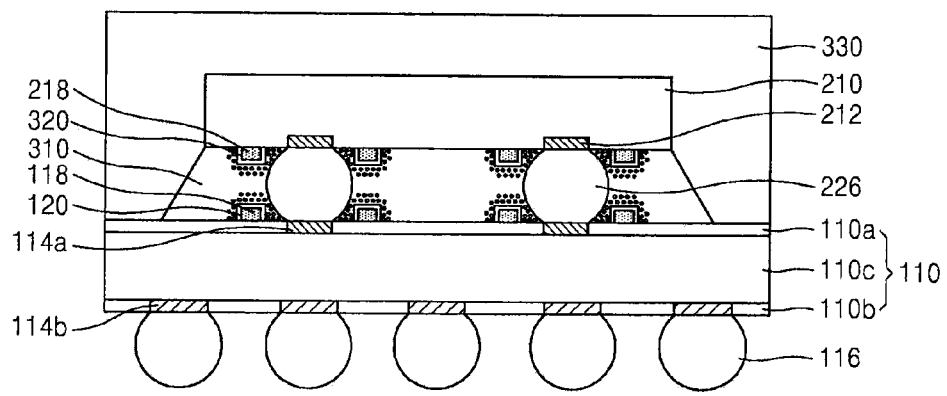
FIG. 7 is a schematic cross-sectional view illustrating a semiconductor package according to some example embodiments.

FIG. 7 is a schematic cross-sectional view illustrating a semiconductor package 5 according to some example embodiments.

Referring to FIG. 7, unlike FIG. 5, the semiconductor package 5 may further include protection layers 120 and 320, respectively, formed on the first heat release patterns 118 and the second heat release patterns 218.

The protection layers 120 and 320 may be used to chemically or mechanically passivate the first heat release patterns 118 and the second heat release patterns 218. For example, the protection layers 120 and 320 may reduce or prevent mechanical deformation of the first heat release patterns 118 and the second heat release patterns 218. For example, the protection layers 120 and 320 may be nitride, etc. However, the inventive concept is not limited thereto.

Figure 8:
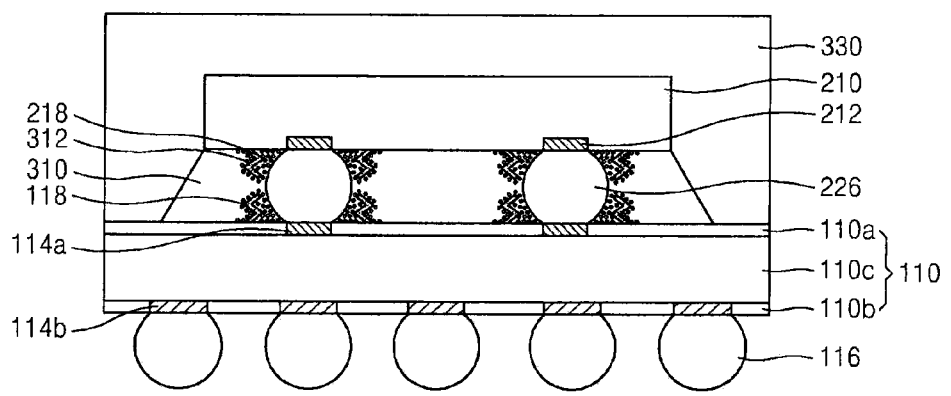
FIG. 8 is a schematic cross-sectional view illustrating a semiconductor package according to some example embodiments.
Figure 9:
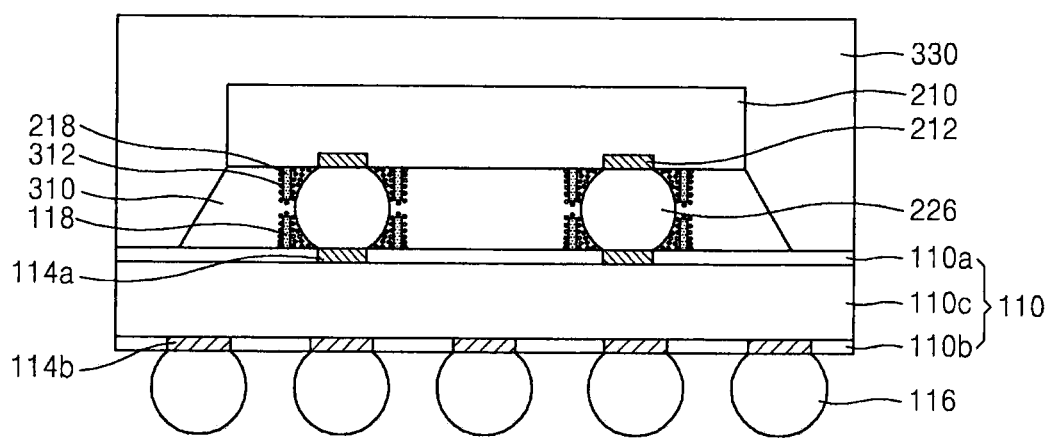
FIG. 9 is a schematic cross-sectional view illustrating a semiconductor package according to some example embodiments.

FIGS. 8 and 9 are schematic cross-sectional view illustrating semiconductor packages 6 and 7, respectively, according to some example embodiments.

Referring to FIG. 8, unlike FIG. 5, the first heat release patterns 118 and the second heat release patterns 218 may have a helix structure. Alternatively, as shown in FIG. 9, the first heat release patterns 118 and the second heat release patterns 218 may have a bar-shaped or cylinder-shaped structure. However, the inventive concept is not limited thereto.

Figure 10:
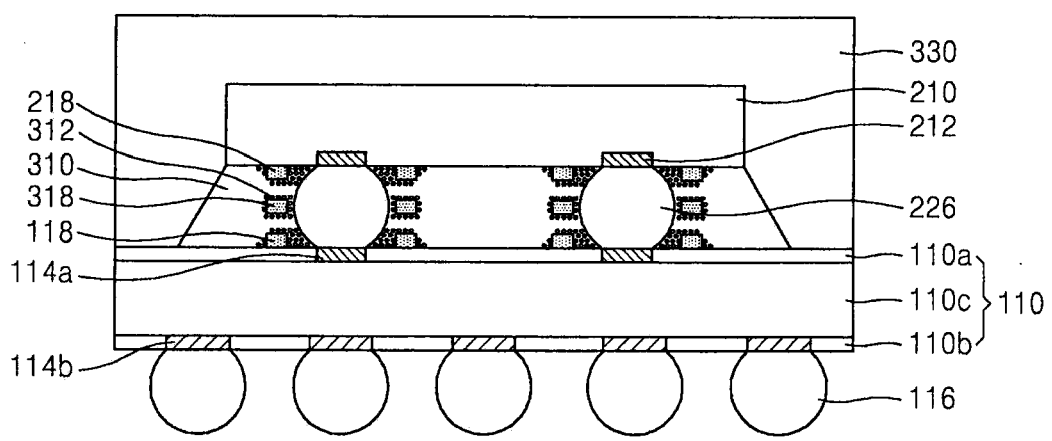
FIG. 10 is a schematic cross-sectional view illustrating a semiconductor package according to some example embodiments.

FIG. 10 is a schematic cross-sectional view illustrating a semiconductor package 8 according to some example embodiments.

Referring to FIG. 10, unlike FIG. 5, the semiconductor package 8 may further include third heat release patterns 318 between the first heat release patterns 118 and the second heat release patterns 218.

The third heat release patterns 318 may be micro heater patterns connected to the first heat release patterns 118 or the second heat release patterns 218. Alternatively, the third heat release patterns 318 may be microwave sensitivity patterns connected to or disconnected from the first heat release patterns 118 or the second heat release patterns 218.

The third heat release patterns 318 may be spaced apart from and formed in one side surfaces of the first connection terminals 226 or may be formed partially or wholly surround the first connection terminals 226. For example, the third heat release patterns 318 may be formed in a doughnut shape. However, the inventive concept is not limited thereto. The third heat release patterns 318 may have different polygonal or closed surface shapes.

The third heat release patterns 318 are spaced apart from the first connection terminals 226, thereby controlling a distribution of the fillers 312 up and down of the first connection terminals 226 by using the first through third heat release patterns 118, 218, and 318.

Figure 11:
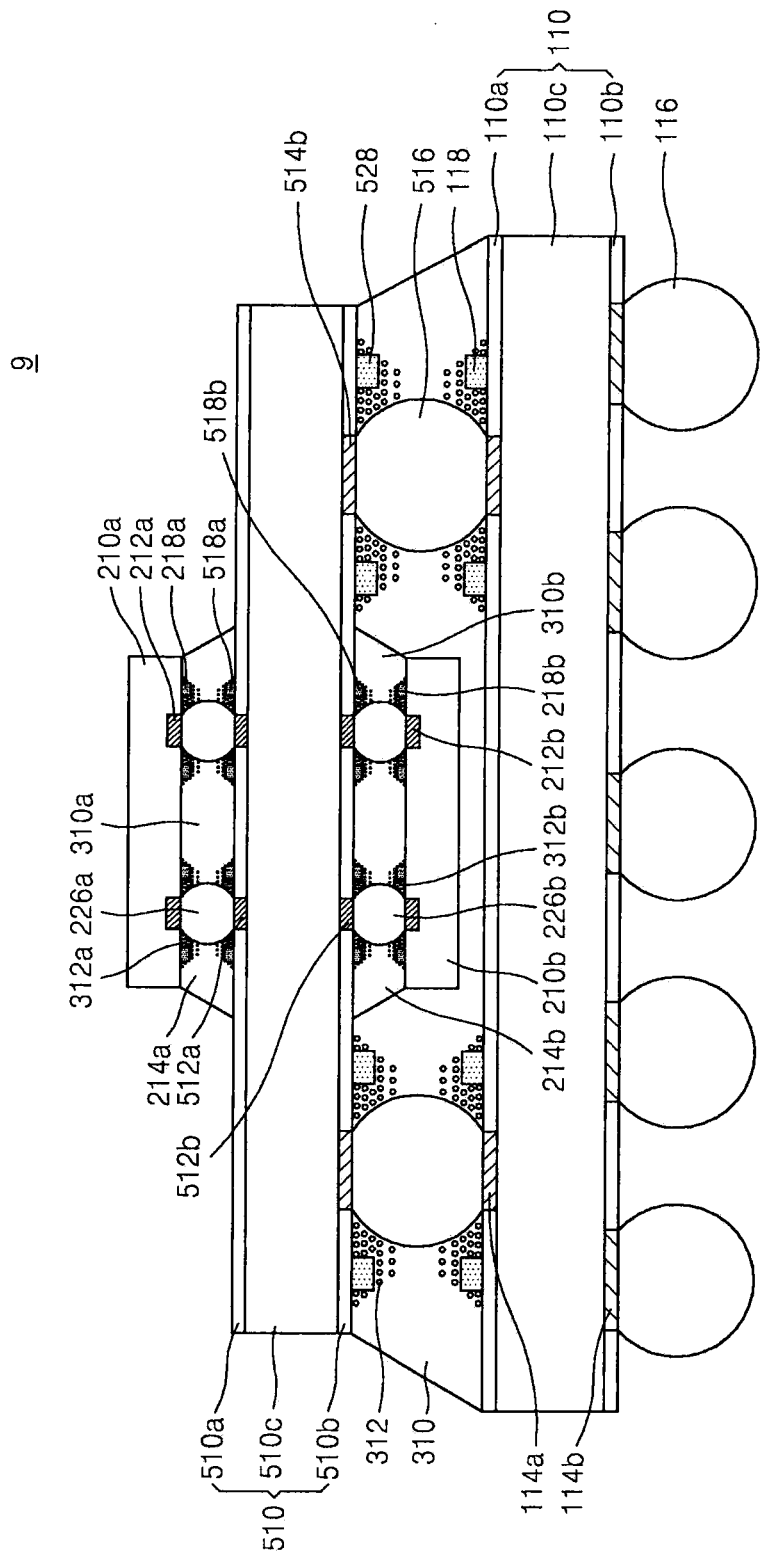
FIG. 11 is a schematic cross-sectional view illustrating a semiconductor package according to some example embodiments.

FIG. 11 is a schematic cross-sectional view illustrating a semiconductor package 9 according to some example embodiments.

Referring to FIG. 11, the semiconductor package 9 may include an interposer 510 including semiconductor chips 210a and 210b mounted up and down through flipchip bonding, and the substrate 110 electrically connected to the interposer 510.

The interposer 510 may include a core board 510c having top and bottom surfaces facing each other, and a first resin layer 510a and a second resin layer 510b formed respectively on the top and bottom surfaces of the core board 510c.

The first resin layer 510a may include first substrate pads 512a and third heat release patterns 518a that are used to electrically connect the substrate 110 and the semiconductor chip 210a. The semiconductor chip 210a may include bonding pads 212a and second heat release patterns 218a in a bottom surface of the semiconductor chip 210a, i.e. an active surface.

The second resin layer 510b may include second substrate pads 512b and third heat release patterns 518b that are used to electrically connect the substrate 110 and the semiconductor chip 210b. The semiconductor chip 210b may include bonding pads 212b and second heat release patterns 218b in a bottom surface of the semiconductor chip 210b, i.e. an active surface.

The second resin layer 510b of the interposer 510 may include third substrate pads 514b for electrically connecting the interposer 510 and an external device. The external device may be, for example, the substrate 110.

First connection terminals 516 may be formed on the third substrate pads 514b. The first connection terminals 516 may be, for example, solder balls, etc. Solder balls may be formed of lead (Pb), tin (Sn), alloy of lead (Pb) and tin (Sn), copper (Cu), aluminum (Al), and the like, and may be formed by a soldering device. However, the inventive concept is not limited thereto.

A method of controlling a distribution of fillers 312a and 312b between the third heat release patterns 518a and 518b formed on the interposer 510 and the second heat release patterns 218a and 218b formed on the semiconductor chips 210a and 210b is the same as described with reference to FIG. 5, and thus the same description therebetween will not be repeated here.

Fourth heat release patterns 528 formed on a bottom surface of the interposer 510 may be microwave sensitivity patterns or micro heater patterns. The first heat release patterns 118 formed on a top surface of the substrate 110 may be microwave sensitivity patterns or micro heater patterns.

A method of controlling a distribution of the fillers 312 between the fourth heat release patterns 528 formed on the bottom surface of the interposer 510 and the first heat release patterns 118 formed on the top surface of the substrate 110 is the same as described with reference to FIG. 5, and thus the same description therebetween will not be repeated here.

As described with reference to FIGS. 1 and 4 through 11, heat release patterns may be used to locally control a distribution of fillers, thereby increasing reliability of a semiconductor package. That is, the distribution of fillers around connection terminals may increase, thereby preventing connection terminals from cracking by increasing modulus near the connection terminals. Also, the distribution of fillers around semiconductor chips other than the connection terminals may be reduced, thereby reducing modulus of underfill resin near the semiconductor chips. Thus, a difference in CTE between semiconductor chips and a substrate may minimize delamination or cracking of the semiconductor chips. Therefore, according to some example embodiments, reliability of semiconductor packages may increase.

FIGS. 12 through 18 are cross-sectional views of a method of forming the semiconductor package 1 of FIG. 1 according to some example embodiments.

Figure 12:
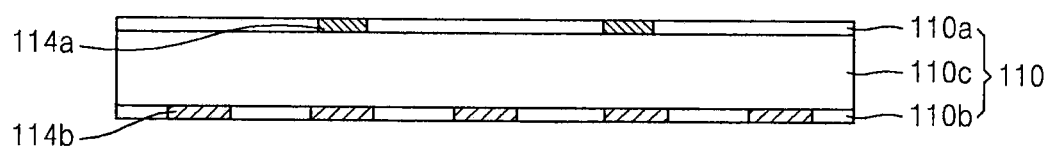
FIGS. 12 through 18 are cross-sectional views of a method of forming the semiconductor package of FIG. 1 according to some example embodiments.

Referring to FIG. 12, the substrate 110 is prepared.

The substrate 110 may be a PCB, a flexible PCB, a tape substrate, and the like. The substrate 110 may include the core board 110c having top and bottom surfaces, and the first resin layer 110a and the second resin layer 110b formed respectively on the top and bottom surfaces of the core board 110c. The first resin layer 110a and/or the second resin layer 110b may have multilayer structures. A signal layer, a ground layer, or a power layer may be disposed between multilayer structures, and may form wire patterns.

The first resin layer 110a may include the first substrate pads 114a for electrically connecting the substrate 110 and the semiconductor chip (210, see FIG. 1).

The second resin layer 110b may include the second substrate pads 114b for electrically connecting the substrate 110 and the second connection terminals (116, see FIG. 1).

Figure 13:
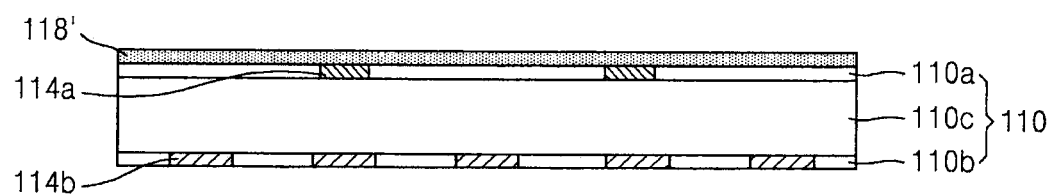

Next, referring to FIG. 13, a first heat release layer 118' may be formed on the first resin layer 110a.

The first heat release layer 118' may be a microwave sensitive layer in which heat is generated by microwave or a micro heat layer in which heat is generated by applying power.

If the first heat release layer 118' is the microwave sensitive layer, the microwave sensitive layer may be formed of a microwave susceptibility material. The microwave susceptibility material may be ferrite, ferrite alloy, carbon, polyester, aluminum, metallic salt, polymer, or the like.

If the first heat release layer 118' is the micro heat layer, the micro heat layer may be formed of molybdenum (Mo), tungsten (W), silicon carbide (SiC), and the like.

Figure 14:
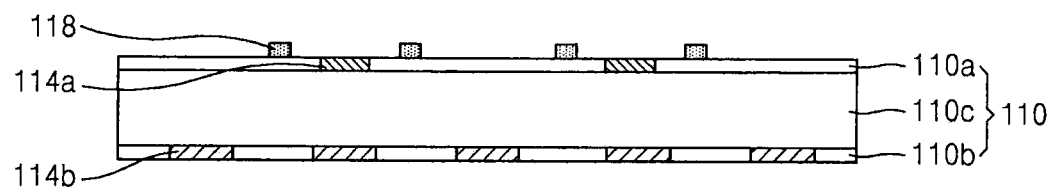

Next, referring to FIGS. 13 and 14, a photoresist layer (not shown) is formed on the first heat release layer 118', and the first heat release patterns 118 are formed by performing a photolithography process on the first heat release layer 118'.

The first heat release patterns 118 may be spaced apart from the first substrate pads 114a. However, the inventive concept is not limited thereto. The first heat release patterns 118 may be formed on upper portions of one side of the first substrate pads 114a.

The first heat release patterns 118 may be formed partially or wholly surround the first substrate pads 114a. For example, the first heat release patterns 118 may be formed in a doughnut shape. However, the inventive concept is not limited thereto. The first heat release patterns 118 may have different polygonal or closed surface shapes.

Since the first heat release patterns 118 may generate high temperature heat, the first heat release patterns 118 may function as controlling a distribution of the fillers (312, see FIG. 16) in such a way that the fillers (312, see FIG. 16) may be collected around the first heat release patterns 118 in an underfill process. That is, the distribution of the fillers (312, see FIG. 16) may be controlled according to locations of the first heat release patterns 118.

Figure 15:
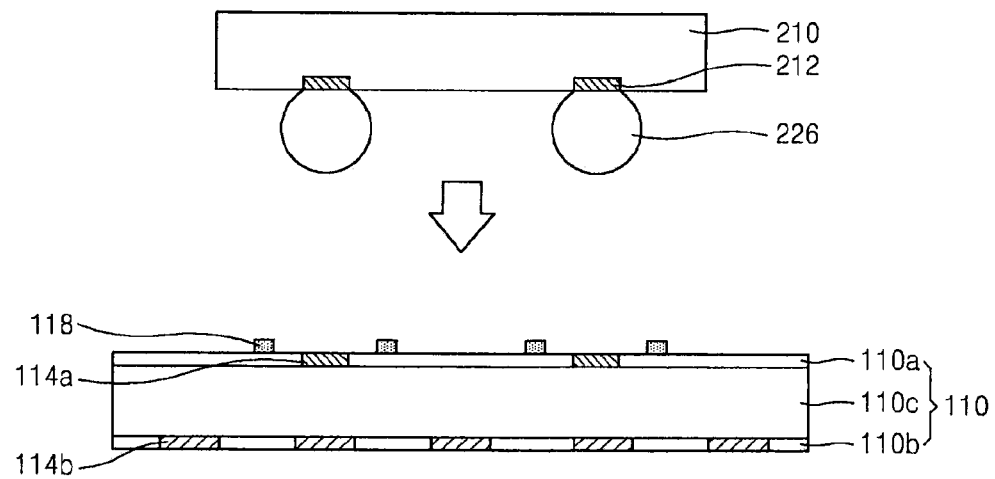

Next, referring to FIG. 15, the semiconductor chip 210 may be electrically connected to the substrate 110 through flipchip bonding.

The semiconductor chip 210 may include an integrated chip therein. For example, the integrated circuit may include a memory circuit or a logic circuit.

Also, one semiconductor chip 210 is shown in FIG. 15 but is not limited thereto. A plurality of semiconductor chips 210 that are electrically connected to each other by using through-silicon vias may be mounted on the substrate 110. In this case, the semiconductor chips 210 may be homogeneous products or heterogeneous products. For example, some of the semiconductor chips 210 may be memory chips, and the others may be non-memory chips. The semiconductor chips 210 may include controllers, flash memory, PRAM, RRAM, FeRAM, MRAM, DRAM, and the like.

Figure 16:
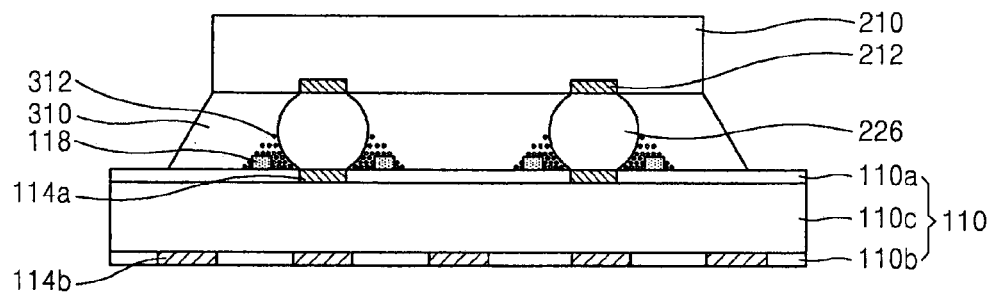

Next, referring to FIG. 16, an underfill process may be performed on a space between the semiconductor chip 210 and the substrate 110.

The underfill process may secure joint reliability between the semiconductor chip 210 and the substrate 110. The underfill resin 310 used in the underfill process may be epoxy resin having low viscosity. However, the inventive concept is not limited thereto.

The underfill process may be performed by including the fillers (312, see FIG. 16). The fillers (312, see FIG. 16) reduce a difference in CTE between the semiconductor chip 210 and the substrate 110, and thus may perform a function of reducing mechanical stress therebetween. For example, the fillers (312, see FIG. 16) may be silica or alumina. However, the inventive concept is not limited thereto.

Next, to control the distribution of the fillers (312, see FIG. 16), the fillers 312 may be collected in lower side surfaces of the first connection terminals 226 by generating high temperature heat to the first heat release patterns 118. Thus, joint reliability between the first connection terminals 226 and the substrate 110 may increase, and the distribution of the fillers 312 around the semiconductor chip 210 other than the first connection terminals 226 may be reduced, thereby minimizing stress that occurs in the semiconductor chip 210.

Figure 17:
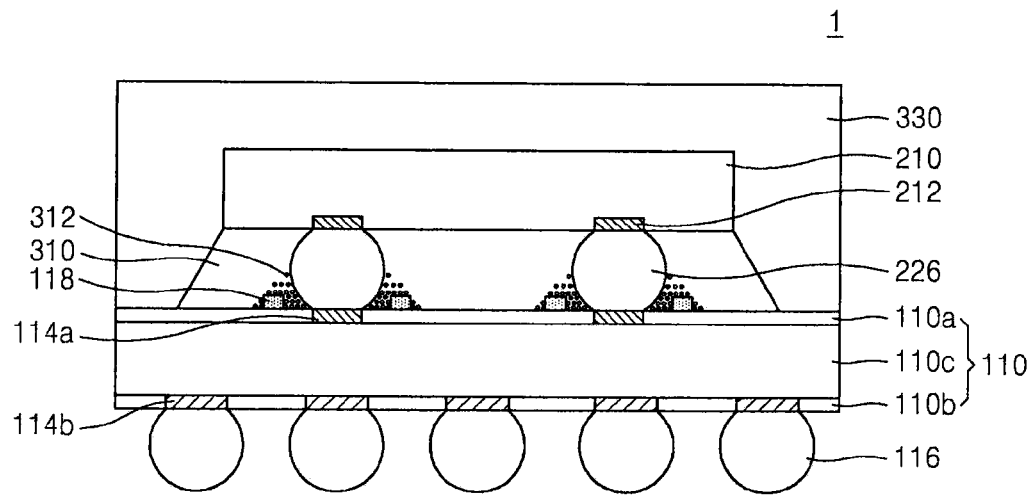
Figure 18:
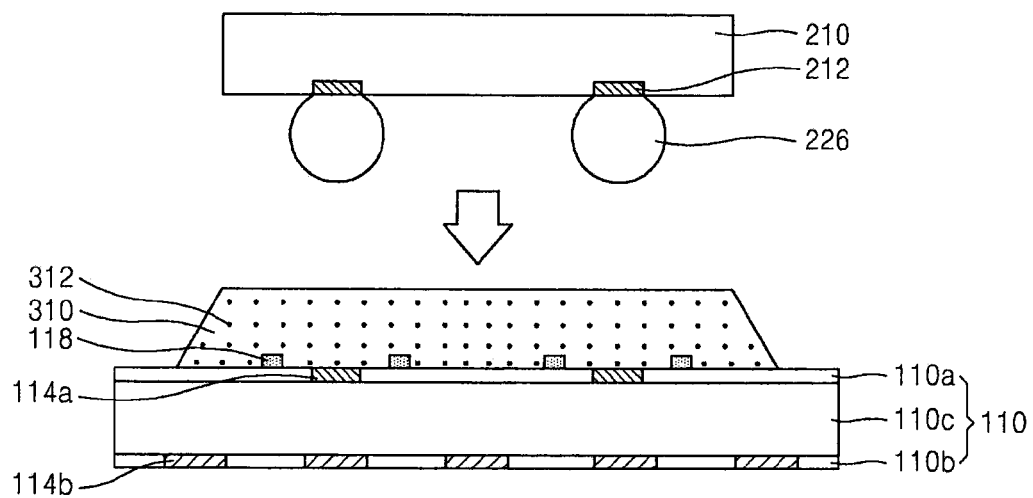

Next, referring to FIG. 17, a top surface of the substrate 110 and side and top surfaces of the semiconductor chip 210 may be encapsulated with the molding member 330.

The molding member 330 may be manufactured by using various synthetic resin materials including epoxy resin, a hardener, organic/inorganic charging materials, etc., and may be ejected and molded inside a mold. The molding member 330 may be formed of polymer like resin, for example, an EMC.

The second connection terminals 116 may be formed on the second substrate pads 114b. The second connection terminals 116 may be, for example, conductive bumps like solder balls, pins, lead lines, and the like. Solder balls may be formed of lead (Pb), tin (Sn), alloy of lead (Pb) and tin (Sn), copper (Cu), aluminum (Al), and the like, and may be formed by a soldering device. However, the inventive concept is not limited thereto.

A method of forming the semiconductor package 1 by using capillary underfill (CUF) is described with reference to FIGS. 12 through 17, but is not limited thereto. As shown in FIG. 15, the semiconductor package 1 may be formed by using non-flow underfill.

Also, a distribution of fillers is controlled in an underfill process by forming heat release patterns on a substrate, but is not limited thereto. The distribution of fillers may be controlled by using heat release patterns inside the substrate or an interposer.

FIGS. 19 through 24 are cross-sectional views of a method of forming the semiconductor package 3 of FIG. 5 according to some example embodiments.

Figure 19:
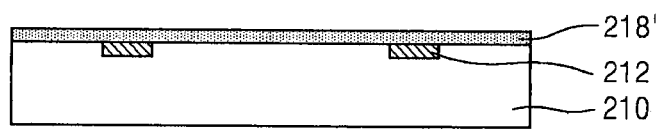
FIGS. 19 through 24 are cross-sectional views of a method of forming the semiconductor package of FIG. 5 according to some example embodiments.

Referring to FIG. 19, a second heat release layer 218' is formed on a top surface of the semiconductor chip 210, i.e. an active surface.

The second heat release layer 218' may be a microwave sensitive layer in which heat is generated by microwave or a micro heat layer in which heat is generated by applying power.

If the second heat release layer 218' is the microwave sensitive layer, the microwave sensitive layer may be formed of a microwave susceptibility material. The microwave susceptibility material may be ferrite, ferrite alloy, carbon, polyester, aluminum, metallic salt, polymer, or the like.

If the second heat release layer 218' is the micro heat layer, the micro heat layer may be formed of molybdenum (Mo), tungsten (W), silicon carbide (SiC), and the like.

Figure 20:
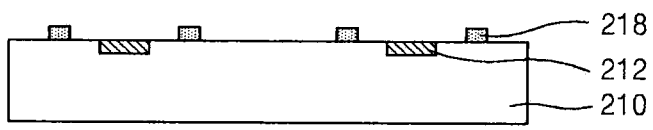

Next, referring to FIGS. 19 and 20, a photoresist layer (not shown) is formed on the second heat release layer 218', and the second heat release patterns 218 are formed by performing a photolithography process on the second heat release layer 218'.

The second heat release patterns 218 may be spaced apart from the bonding pads 212. However, the inventive concept is not limited thereto. The second heat release patterns 218 may be formed on lower portions of one side of the bonding pads 212.

The second heat release patterns 218 may be formed partially or wholly surround the first substrate pads 114a. For example, the second heat release patterns 218 may be formed in a doughnut shape. However, the inventive concept is not limited thereto. The second heat release patterns 218 may have different polygonal or closed surface shapes.

Figure 21:
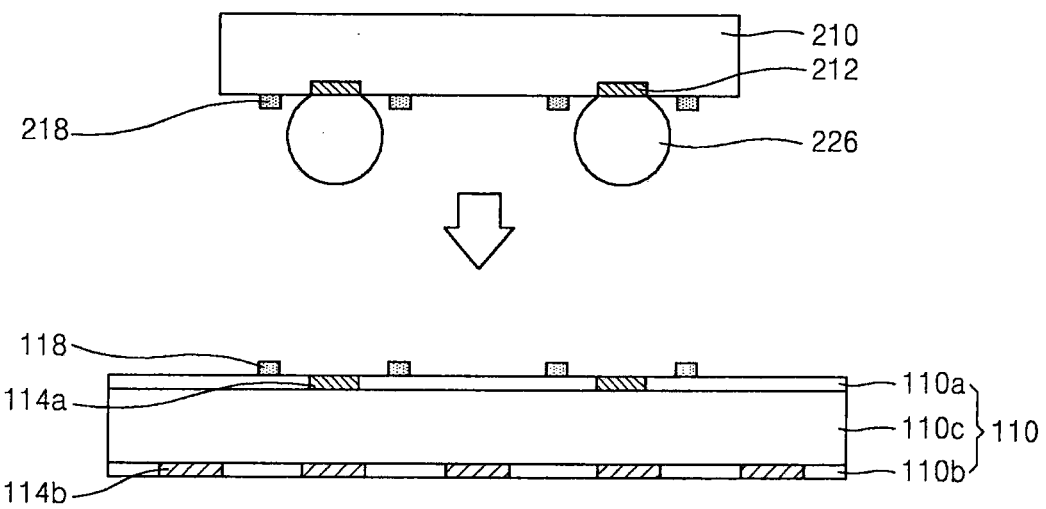

Next, referring to FIG. 21, the semiconductor chip 210 may be electrically connected to the substrate 110 through flipchip bonding.

The substrate 110 is formed by using the method described with reference to FIGS. 12 through 14, and thus a description thereof will not be repeated here.

Figure 22:
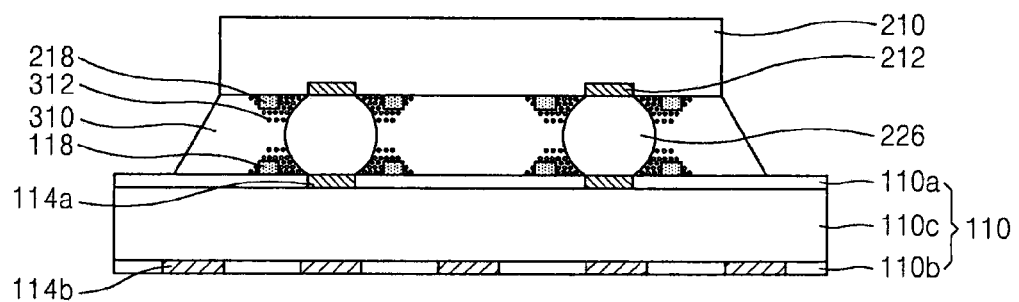

Next, referring to FIGS. 21 and 22, an underfill process may be performed on a space between the semiconductor chip 210 and the substrate 110.

The underfill process may secure joint reliability between the semiconductor chip 210 and the substrate 110. The underfill resin 310 used in the underfill process may be epoxy resin having low viscosity. However, the inventive concept is not limited thereto.

The underfill process may be performed by including the fillers 312 that reduce a difference in CTE between the semiconductor chip 210 and the substrate 110, and thus may perform a function of reducing mechanical stress therebetween. For example, the fillers 312 may be silica or alumina. However, the inventive concept is not limited thereto.

Next, to control the distribution of the fillers 312, the fillers 312 may be collected in upper and lower side surfaces of the first connection terminals 226 by generating high temperature heat to the first and second heat release patterns 118 and 218.

The first heat release patterns 118 may be microwave sensitivity patterns or micro heater patterns. The second heat release patterns 218 may be microwave sensitivity patterns or micro heater patterns.

The fillers 312 collected in upper and lower side surfaces of the first connection terminals 226 may be distributed in a vertical direction as well as a small amount thereof may be distributed on a bottom surface of the semiconductor chip 210 contacting the underfill resin 310 or the top surface of the substrate 110, by controlling a temperature of heat generated in the first and second heat release patterns 118 and 218.

Thus, join reliability between upper portions of the first connection terminals 226 and the semiconductor chip 210, and join reliability between lower portions of the first connection terminals 226 and the semiconductor chip 210 may increase. Also, the distribution of the fillers 312 near the semiconductor chip 210 other than the first connection terminals 226 may be reduced, thereby minimizing stress that occurs in the semiconductor chip 210.

Figure 23:
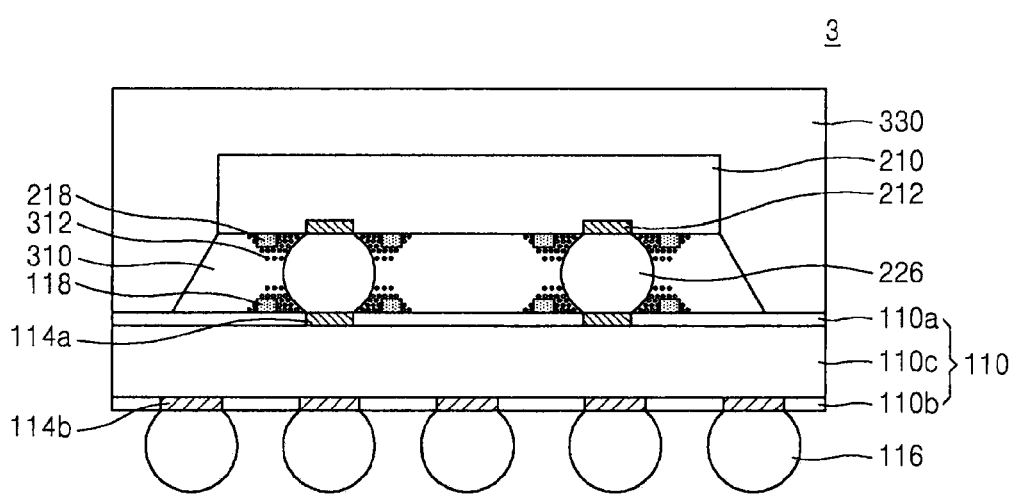

Next, referring to FIG. 23, a top surface of the substrate 110 and side and top surfaces of the semiconductor chip 210 may be encapsulated with the molding member 330.

The molding member 330 may be manufactured by using various synthetic resin materials including epoxy resin, a hardener, organic/inorganic charging materials, etc., and may be ejected and molded inside a mold. The molding member 330 may be formed of polymer like resin, for example, EMC.

The second connection terminals 116 may be formed on the second substrate pads 114b. The second connection terminals 116 may be, for example, conductive bumps like solder balls, pins, lead lines, and the like. Solder balls may be formed of lead (Pb), tin (Sn), alloy of lead (Pb) and tin (Sn), copper (Cu), aluminum (Al), and the like, and may be formed by a soldering device. However, the inventive concept is not limited thereto.

Figure 24:
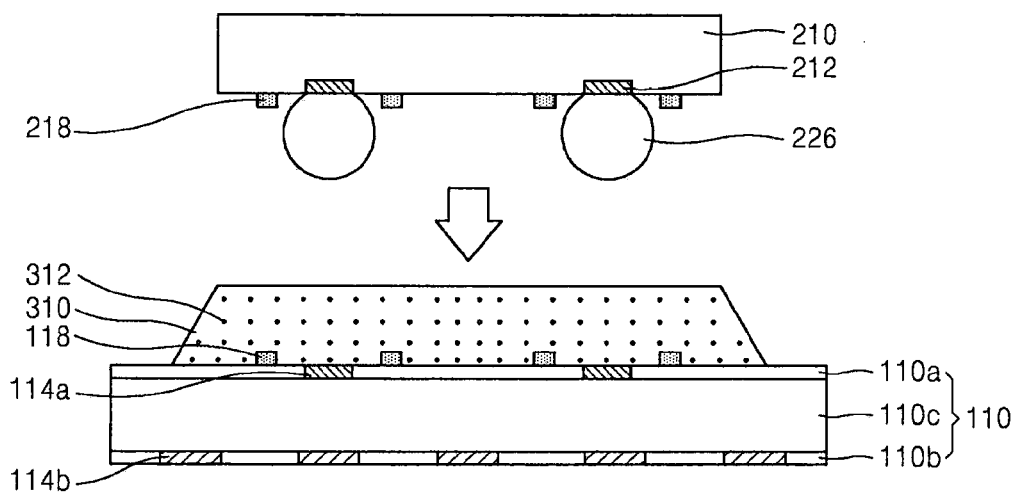

A method of forming the semiconductor package 3 by using CUF is described with reference to FIGS. 19 through 23, but is not limited thereto. As shown in FIG. 24, the semiconductor package 3 may be formed by using non-flow underfill.

Also, a distribution of fillers is controlled in an underfill process by forming heat release patterns on a substrate, but is not limited thereto. The distribution of fillers may be controlled by using heat release patterns inside the substrate or an interposer.

Figure 25:
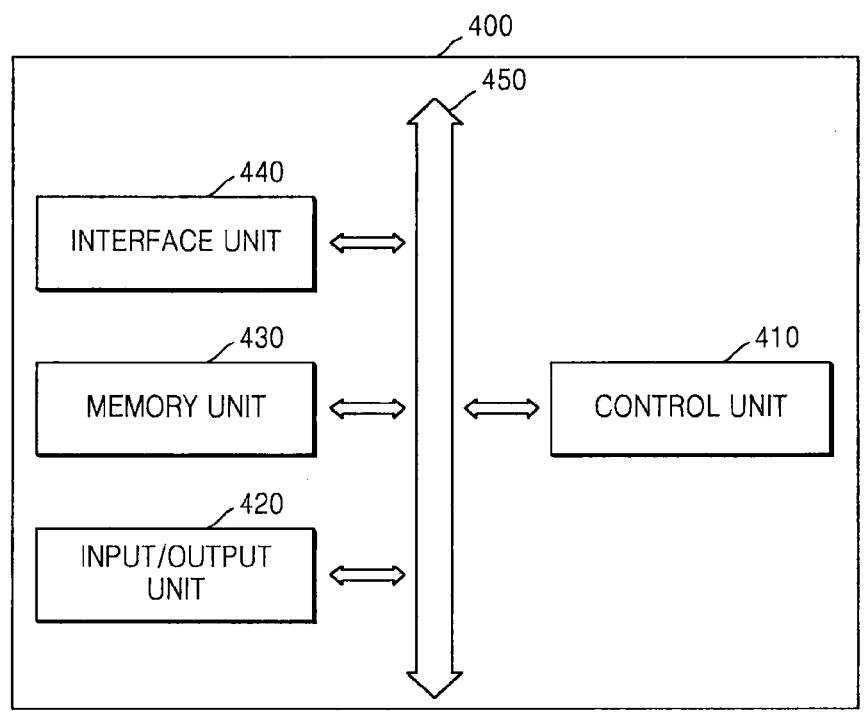
FIG. 25 is a block diagram of a system according to some example embodiments.

FIG. 25 is a block diagram of a system 400 according to some example embodiments.

Referring to FIG. 25, the system 400 may include a control unit 410, an input/output unit 420, a memory unit 430, and an interface unit 440.

The system 400 may be a mobile system or a system for transmitting or receiving data. The mobile system may include a personal digital assistant (PDA), a portable computer, a web tablet, a wireless phone, a mobile telephone, a digital music player, or a memory card.

The control unit 410 may function to execute a program and control the system 400. The control unit 410 may include, for example, a microprocessor, a digital signal processor, a microcontroller, or a similar device.

The input/output unit 420 may be used to input or output data into or from the system 400. The system 400 may be connected to an external device, for example, a personal computer or a network, by using the input/output unit 420 and exchange data with the external device. The input/output unit 420 may include, for example, a keyboard, a keypad, or a display device.

The memory unit 430 may store a code and/or data used for an operation of the control unit 410, and/or may store data processed by the control unit 410. The memory unit 430 may include a semiconductor package according to one of the embodiments of the inventive concept.

The interface unit 440 may be a data transfer path between the system 400 and another external apparatus. The control unit 410, the input/output unit 420, the memory unit 430, and the interface unit 440 may communicate with each other through a bus 450. For example, the system 400 may be used for a mobile phone, an MP3 player, a navigation apparatus, a portable multimedia player (PMP), a solid state disk (SSD), or a household appliance.

Figure 26:
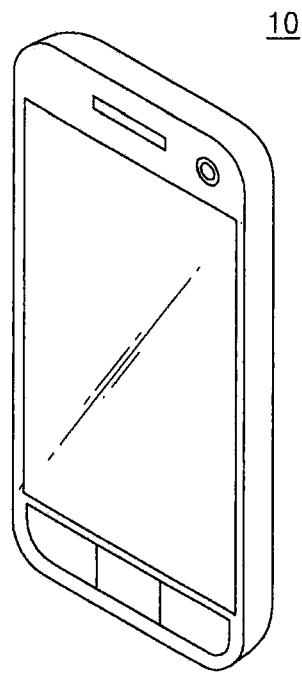
FIG. 26 is a perspective view of an electronic apparatus that may include a semiconductor package manufactured according to some example embodiments.

FIG. 26 is a perspective view of an electronic apparatus that may include a semiconductor package manufactured according to some example embodiments.

Referring to FIG. 26, the system 400 (see FIG. 25) is applied to a mobile phone 10. In addition, the system 400 (see FIG. 25) may be applied to a notebook, an MP3 player, a navigation apparatus, an SSD, a car, or a household appliance.

While example embodiments have been particularly shown and described, it will be understood by those of ordinary skill in the art that various changes in form and details may be made therein without departing from the spirit and scope of the present invention as defined by the following claims.

What is claimed is:

1. A semiconductor package, comprising:
   a substrate comprising a substrate pad on a top surface thereof;
   at least one semiconductor chip comprising a connection terminal electrically connected to the substrate on an active surface thereof, and mounted on the substrate;
   a heat release pattern formed between the substrate and the at least one semiconductor chip and configured to generate heat; and
   underfill resin underfilled between the substrate and the at least one semiconductor chip and comprising fillers.

2. The semiconductor package of claim 1, wherein the heat release pattern is a microwave sensitive pattern in which heat is generated by microwaves or a micro heat pattern in which heat is generated by applying power.

3. The semiconductor package of claim 1, wherein the heat release pattern has a doughnut, bar, cylinder, or helix shape.

4. The semiconductor package of claim 1, wherein the heat release pattern is formed on a top surface of the substrate.

5. The semiconductor package of claim 1, wherein the heat release pattern is spaced apart from the substrate pad or from an upper portion of one side of the substrate pad.

6. The semiconductor package of claim 1, wherein the heat release pattern is formed to partially or wholly surround the substrate pad.

7. The semiconductor package of claim 1, wherein the heat release pattern is formed on the active surface of the at least one semiconductor chip.

8. The semiconductor package of claim 1, wherein the at least one semiconductor chip is electrically connected to the substrate through flipchip bonding.

9. The semiconductor package of claim 1, wherein the active surface of the at least one semiconductor chip faces the substrate, and
   wherein the at least one semiconductor chip further comprises a bonding pad formed on the active surface and electrically connected to the connection terminal.

10. The semiconductor package of claim 9, wherein the heat release pattern is spaced apart from the bonding pad or from a lower portion of one side of the bonding pad, and
    wherein the heat release pattern is formed to partially or wholly surround the bonding pad.

11. The semiconductor package of claim 1, wherein the at least one semiconductor chip is formed by stacking a plurality of semiconductor chips and electrically connecting the plurality of semiconductor chips by using through-silicon vias.

12. A semiconductor package, comprising:
    a substrate comprising a substrate pad on a top surface thereof and a first heat release pattern configured to generate heat; and
    a semiconductor chip comprising a bonding pad formed on an active surface facing the substrate and a second heat release pattern configured to generate heat.

13. The semiconductor package of claim 12, further comprising:
    a connection terminal formed between the substrate and the semiconductor chip and configured to electrically connect the substrate and the semiconductor chip; and
    a third heat release pattern formed on one side surface of the connection terminal or formed to partially or wholly surround the connection terminal and configured to generate heat.

14. The semiconductor package of claim 12, further comprising:
    a protection layer formed on the first heat release pattern or the second heat release pattern.

15. The semiconductor package of claim 12, wherein the first heat release pattern is spaced apart from the substrate pad and is formed to partially or wholly surround the substrate pad, and
    wherein the second heat release pattern is spaced apart from the bonding pad and is formed to partially or wholly surround the bonding pad.

16. A semiconductor package, comprising:
    a substrate;
    at least one semiconductor chip on the substrate; and
    a heat release pattern between the substrate and the at least one semiconductor chip;
    wherein the at least one semiconductor chip is electrically connected to the substrate, and
    wherein the heat release pattern is configured to generate heat.

17. The semiconductor package of claim 16, further comprising:
    resin between the substrate and the at least one semiconductor chip.

18. The semiconductor package of claim 17, wherein the resin comprises one or more fillers.

19. The semiconductor package of claim 17, wherein the heat release pattern comprises one or more microwave sensitive patterns configured to generate heat using microwaves.

20. The semiconductor package of claim 17, wherein the heat release pattern comprises one or more micro heat patterns configured to generate heat using power applied to the one or more micro heat patterns.

* * * * *